United States Patent
Petyushko et al.

(10) Patent No.: US 9,037,944 B2
(45) Date of Patent: May 19, 2015

(54) METHOD FOR SELECTING A LDPC CANDIDATE CODE

(71) Applicant: LSI Corporation, Milpitas, CA (US)

(72) Inventors: Alexander Alexandrovich Petyushko, Bryansk (RU); Anatoli Aleksandrovich Bolotov, San Jose, CA (US); Yang Han, Sunnyvale, CA (US); Ivan Leonidovich Mazurenko, Khimki (RU); Alexander Borisovich Kholodenko, Moscow (RU); Denis Vladimirovich Zaytsev, Dzerzhinsky (RU); Denis Vasilievich Parfenov, Moscow (RU)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 36 days.

(21) Appl. No.: 13/671,640

(22) Filed: Nov. 8, 2012

(65) Prior Publication Data
US 2014/0053038 A1 Feb. 20, 2014

(51) Int. Cl.
*H03M 13/13* (2006.01)
*H03M 13/01* (2006.01)
*H03M 13/11* (2006.01)

(52) U.S. Cl.
CPC ........ *H03M 13/015* (2013.01); *H03M 13/1102* (2013.01)

(58) Field of Classification Search
CPC .......... H03M 13/1102; H03M 13/116; H03M 13/1111; H03M 13/1137; H04L 1/0057; H04L 1/0041
USPC ................... 714/758, 752, E11.032
See application file for complete search history.

(56) References Cited

U.S. PATENT DOCUMENTS

| | | | |
|---|---|---|---|
| 8,196,016 B1* | 6/2012 | Langner et al. | 714/758 |
| 2005/0204253 A1* | 9/2005 | Sukhobok et al. | 714/752 |
| 2009/0172501 A1* | 7/2009 | Lablans | 714/784 |
| 2010/0299572 A1* | 11/2010 | Yokokawa et al. | 714/752 |
| 2011/0041029 A1 | 2/2011 | Yedidia et al. | |
| 2011/0185251 A1* | 7/2011 | d'Abreu et al. | 714/752 |
| 2011/0305082 A1* | 12/2011 | Haratsch et al. | 365/185.03 |

* cited by examiner

*Primary Examiner* — Albert Decady
*Assistant Examiner* — Kyle Vallecillo
(74) *Attorney, Agent, or Firm* — Suiter Swantz pc llo

(57) ABSTRACT

A method for estimating error probability of LDPC codes includes ordering LDPC codes according to features in each code with known error characteristics. The method includes identifying features in each LDPC code having known error characteristics; adding each code to one or more categories based on the existence of such features; and ranking the LDPC codes according to the level of error risk.

20 Claims, 13 Drawing Sheets

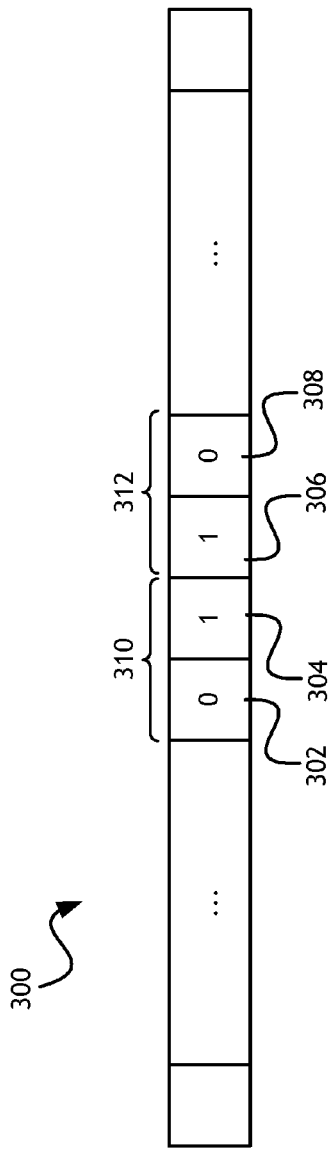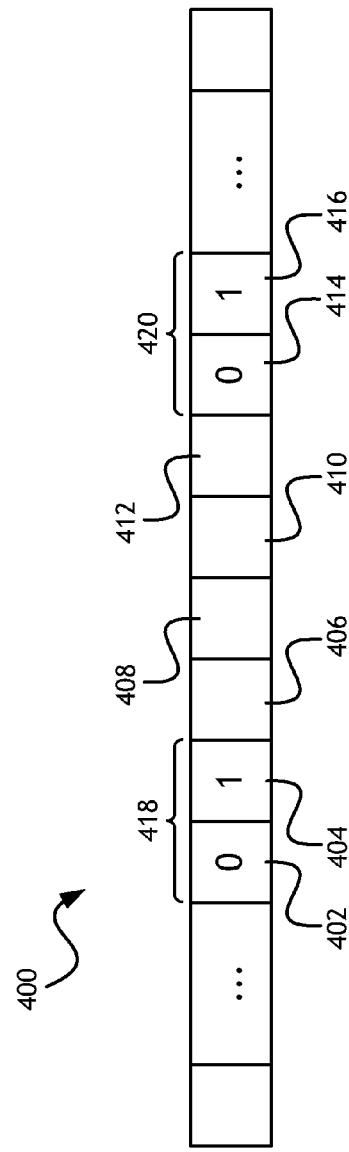

METHOD FOR SELECTING A LDPC CANDIDATE CODE

PRIORITY

The present application claims the benefit under 35 U.S.C. §119(a) of Russian Patent Application Serial Number 2012134916, filed Aug. 15, 2012, which is incorporated herein by reference.

FIELD OF THE INVENTION

The present invention is directed generally toward low-density parity check (LDPC) codes, and more particularly toward methods for estimating error characteristics for LDPC codes.

BACKGROUND OF THE INVENTION

In most real signal transmission applications there can be several sources of noise and distortions between the source of the signal and its receiver. As a result, there is a strong need to correct mistakes in the received signal. As a solution for this task one should use some coding technique with adding some additional information (i.e., additional bits to the source signal) to ensure correcting errors in the output distorted signal and decoding it. One type of coding technique utilizes low-density parity-check (LDPC) codes. LDPC codes are used because of their fast decoding (linearly depending on codeword length) property.

For large block sizes, LDPC codes are commonly constructed by first studying the behavior of decoders. LDPC codes are capacity-approaching codes, i.e. these codes can approach channel capacity for standard additive white Gaussian noise (AWGN) channels.

The construction of a specific LDPC code utilizes two main techniques; pseudo-random approaches and combinatorial approaches. Construction by a pseudo-random approach builds on theoretical results that, for large block sizes, give good decoding performance. In general, pseudo-random codes have complex encoders; however pseudo-random codes with the best decoders can have simple encoders. Various constraints are often applied to help ensure that the desired properties expected at the theoretical limit of infinite block size occur at a finite block size. Combinatorial approaches can be used to optimize properties of small block-size LDPC codes or to create codes with simple encoders.

LDPC codes are linear codes with a sparse parity-check matrix. Sparse here means that the number of non-zero elements is a linear function of the size of the codewords.

It is known that decoding a LDPC code on the binary symmetric channel is an NP-complete problem. So in order to ensure fast (linear) decoding, different techniques based on iterative belief-propagation are used and give good approximations. But on the output of such iterative methods we can have words that are not codeword (because of the nature of belief-propagation, the level of noise and so on), but some other word.

An output of such iterative methods which doesn't coincide with the original codeword may still be a valid codeword. This is a very bad situation for the decoder because the decoder does not have the ability to identify the valid but erroneous word. Hereafter such a situation will be called a miscorrection.

There exists a well-known technique called Importance Sampling, which is the modification of a Monte-Carlo method for the region which has the biggest error probability.

One of the applications of the Importance Sampling method for finding low error rates (having the small level of noise) is the Cole method presented in a paper by Cole et al (A General Method for Finding Low Error Rates of LDPC Codes) hereby incorporated by reference. The Cole method deals with so-called trapping sets or near codewords, i.e. some words, which are not codewords but can be converted to codewords with small effort, and leading to errors in case of small levels of noise. A trapping set is a set of variable nodes that is not well connected to the rest of the tanner graph, forming relatively isolated subgraphs, in a way that causes error conditions in the decoder. Trapping sets depend on the decoder's parity check matrix, and on the decoding algorithm.

The second step of the Cole method is used to select dominant (i.e. having more impact on probability of error) codewords and trapping sets from a list of codewords.

Unlike additive white Gaussian noise (AWGN) channel there exist a variety of other channel types with ISI (inter symbol interference) like PR (partial response) or Jitter channels. For these channels the second step of the Cole method will give significantly different estimations of error boundary distance for different random codewords. These non-stationary features of such channels require considering a set of randomly chosen original codewords. The straightforward approach is to calculate an arithmetic average error boundary distances along a big number of random codewords. It can be experimentally shown that due to the distribution of error boundary distance along all random codewords this averaging in most cases does not give a good estimation of trapping set impact on overall error probability and thus does not allow to reliably sort out dominant trapping sets. Moreover, estimating the average distance has a tendency to diverge as a number of random codewords increase.

The error floor phenomenon is related to all iterative decoding of LDPC codes. It was discovered that the error floors under message-passing iterative decoding are usually due to low-weight trapping sets rather than low-weight codewords. Another (more rare) type of errors is related to miscorrection events mentioned above.

Estimating probability of error could be made by running a direct simulation. But considering the real levels of error for high signal-to-noise ratios in modern hard disk drives, there is no possibility to get a real error probability estimation in a reasonable time.

Consequently, it would be advantageous if an apparatus existed that is suitable for efficiently estimating error probability of LDPC codes.

SUMMARY OF THE INVENTION

Accordingly, the present invention is directed to a novel method and apparatus for efficiently estimating error probability of LDPC codes.

One embodiment of the present invention is a processor configured to analyze aspects of one or more LDPC codes for features having known error characteristics. The processor categorizes each LDPC code according to the features present in each LDPC code and ranks the codes accordingly.

Another embodiment of the present invention is a method for ordering LDPC codes according to features in each code with known error characteristics. The method includes identifying features in each LDPC code having known error characteristics; adding each code to one or more categories based on the existence of such features; and ranking the LDPC codes according to the level of error risk.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which:

FIG. 3 shows a block representation of adjacent code symbols in a LDPC codeword;

FIG. 4 shows a block representation of repeating symbols in a LDPC codeword;

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
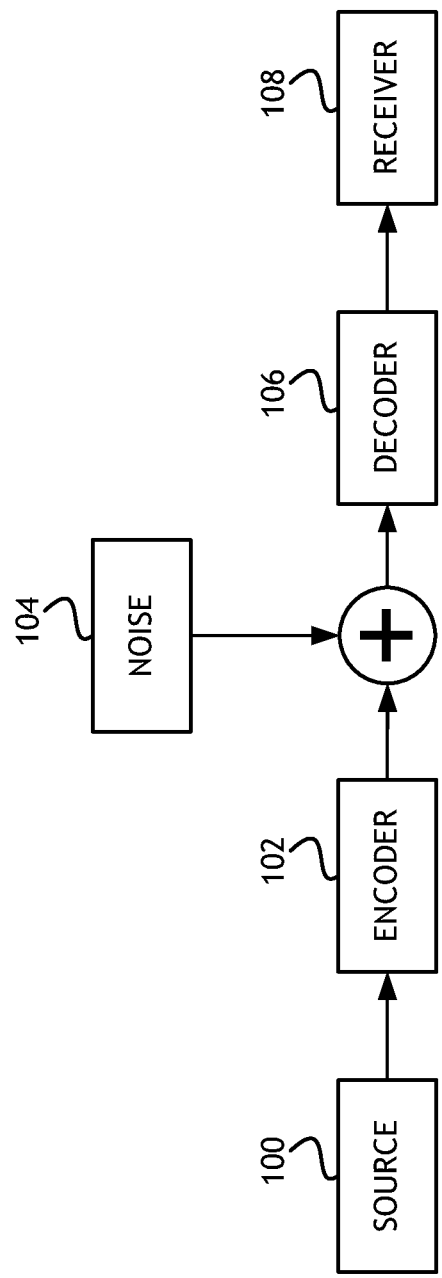
FIG. 1 shows a block diagram of a data transmission path for a LDPC code.

Referring to FIG. 1, a block diagram of a data transmission path for a LDPC code is shown. The standard data transmission path may include a signal source 100 that generates a signal for transmission. The present invention may relate to digital signals. The signal produced by the source 100 may be encoded by an encoder 102. The encoder 102 may be a processor configured to add features to the signal that enhance data integrity. For example, the encoder 102 may add data bits to the signal according to some predetermined algorithm so that the signal may be recovered in the event of distortion. An example of a predetermined algorithm may include an LDPC code configured to add one or more parity bits to the each codeword in the signal.

The encoded signal may then be transmitted. During transmission, signals may be subjected to noise 104. Noise 104 may distort one or more bits of the signal such that the signal is no longer an accurate representation of the signal produced by the source 100. The noise distorted signal may then be received by a decoder 106. The decoder 106 may analyze the noise distorted signal according to an algorithm complimentary to the algorithm used by the encoder 104. Where the algorithm includes a LDPC code, the decoder 106 may utilize one or more parity bits generated by the LDPC code to recover noise distorted bits in the noise distorted signal. The recovered signal may then be sent to a receiver 108.

Figure 2:
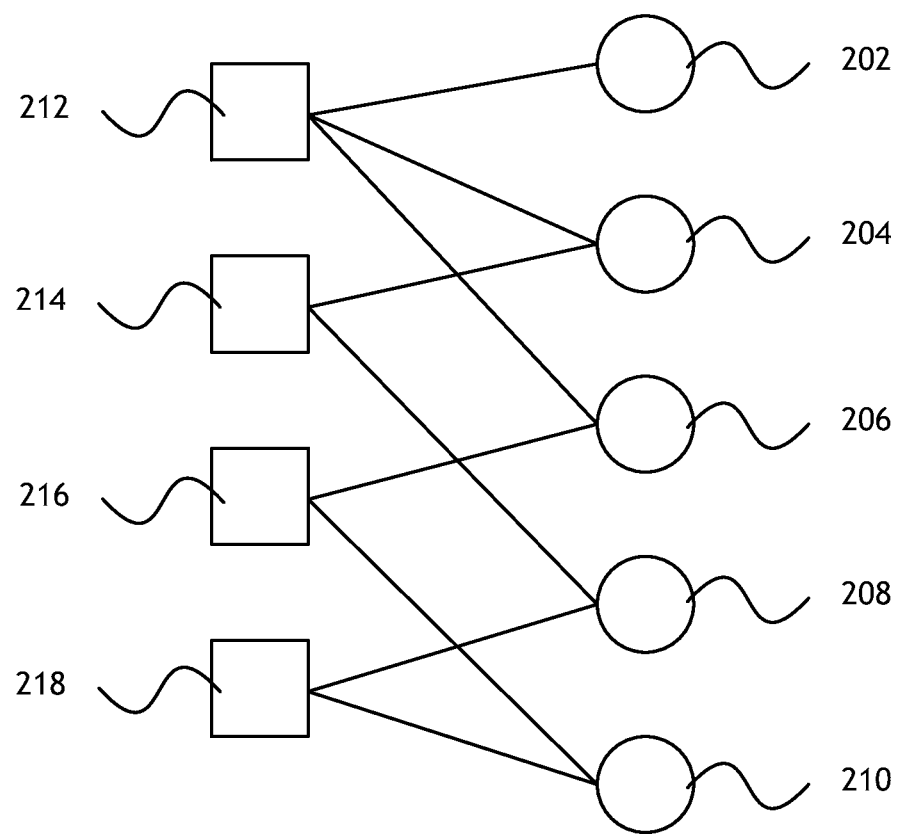
FIG. 2 shows a tanner graph of a LDPC code.

Referring to FIG. 2, a tanner graph of a LDPC code is shown. A tanner graph related to a LDPC code is a graphic representation of the corresponding parity-check matrix. The columns of that matrix may be represented by variable nodes 202, 204, 206, 208, 210 and the rows (check equations) may be represented by check nodes 212, 214, 216, 218. The tanner graph in FIG. 2 shows a LDPC code wherein a first check node 212 represents an equation corresponding to the parity-check matrix having the following non-zero variables: a first variable node 202, a second variable node 204 and a third variable node 206; a second check node 214 represents an equation having the following non-zero variables: the second variable node 204 and a fourth variable node 208; a third check node 216 represents an equation having the following non-zero variables: the third variable node 206 and a fifth variable node 210; and a fourth check node 218 represents an equation having the following non-zero variables: the fourth variable node 208 and the fifth variable node 210. One skilled in the art may appreciate that a tanner graph may be a representation of a LDPC code parity-check matrix, where check nodes correspond to rows, variable nodes correspond to columns, and check node and variable node are connected if a nonzero value stays in the intersection of the corresponding row and column.

There are two potential error conditions based on signal noise in LDPC decoding. In the first error condition, the signal received by the decoder does not correspond to a valid codeword; in that case the decoder may be able to recover the signal based on an algorithm using parity information contained in the signal, or the signal may be unrecoverable if the distortion is severe enough. The second error condition, herein called miscorrection, involves a distorted signal that is decoded to a valid but incorrect codeword, in which case the decoder may falsely believe that the signal has been properly decoded. Miscorrection may result when a valid codeword is distorted by noise in a particular way such that the distorted signal becomes closer to another (incorrect) valid code word, different from the correct one. The conditions that may produce miscorrection are specific to the particular LDPC code; furthermore, the probability of miscorrection may be associated with the nature and extent of signal noise, and the statistical distribution of various codewords.

Signal noise may include AWGN, partial response (PR), jitter, or other effects due to noisy transmission channels.

Selecting a LDPC code for a particular application involves analyzing the properties of various LDPC codes to select one with desirable error probabilities for the application. However, identifying error probabilities for a set of candidate LDPC codes may be a laborious and time consuming task. Estimating error probabilities may simplify the task of selecting a LDPC code.

Referring to FIG. 3, a block representation of adjacent code symbols in a LDPC codeword is shown. A LDPC codeword may be comprised of a number of adjacent symbols 310, 312, each symbol 310, 312 a member of a Galois (finite) field of valid symbols. For example, each symbol 310, 312 may be comprised of two bits 302, 304, 306, 308. A first symbol 310 may be comprised of a first bit 302 and a second bit 304; and a second symbol 312 may be comprised of a first bit 306 and a second bit 308. In this example, each symbol 310, 312 may comprise one of four potential symbols in a finite field. One skilled in the art may appreciated that even though symbols 310, 312 of two bits 302, 304, 306, 308 each are shown, symbols 310, 312 may be defined according to a finite field for more than two bits.

Adjacent, non-zero bits in two separate symbols, for example the second bit 304 of the first symbol 310 and the first bit 306 of the second symbol 312, may interfere with each other in noisy transmission channels. Interference may also be a factor where adjacent non-zero bits occur within a single symbol or multiple times within and between multiple symbols.

One skilled in the art may appreciate that even though features of a codeword are described, the features described herein may also be applicable to trapping sets.

Referring to FIG. 4, a block representation of repeating symbols in a LDPC codeword is shown. A LDPC codeword may be comprised of a number of symbols 418, 420, each symbol 418, 420 a member of a finite field of valid symbols. For example, each symbol 418, 420 may be comprised of two bits 402, 404, 414, 416. A first symbol 418 may be comprised of a first bit 402 and a second bit 404; and a second symbol 420 may be comprised of a first bit 414 and a second bit 416. In this example, each symbol 418, 420 may comprise one of four potential symbols in a finite field. One skilled in the art may appreciated that even though symbols 418, 420 of two bits 402, 404, 414, 416 each are shown, symbols 418, 420 may be defined according to a finite field for more than two bits.

One feature of a codeword that may impact error characteristics is the distance between non-zero bits in separate symbols 418, 420. In this example, the second bit 404 of the first symbol 418 and the second bit 416 of the second symbol 420 may be separated by five intervening bits 406, 408, 410, 412, 414.

One skilled in the art may appreciate that even though features of a codeword are described, the features described herein may also be applicable to trapping sets.

Figure 5:
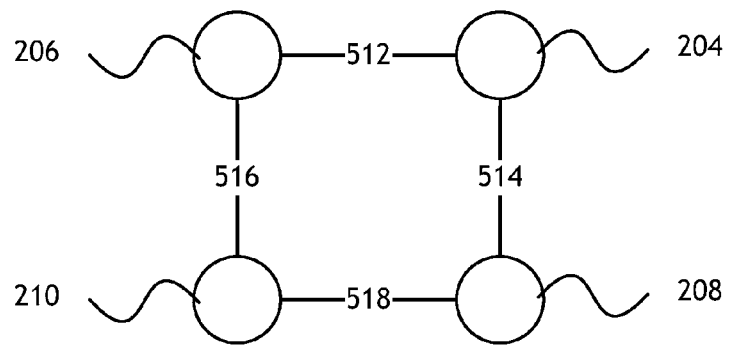
FIG. 5 shows a modified tanner graph of a LDPC code.

Referring to FIG. 5, a modified tanner graph of a LDPC code is shown. In certain embodiments of the present invention, it may be advantageous to a modified version of the tanner graph for a particular LDPC code. In regards to the present invention, a modified tanner graph may refer to a graph having only variable nodes corresponding to symbols of a particular word and edges corresponding to check nodes associated with each connected variable node. For example, a modified tanner graph of the tanner graph in FIG. 2 may comprise the second nod 204, third node 206, fourth node 208 and fifth node 210; the modified tanner graph may also include a first edge 512 connecting the second node 214 and the third node 206, a second edge 514 connecting the second node 204 and the fourth node 208; a third edge 516 connecting the third node 206 and the fifth node 210, and a fourth edge 518 connecting the fourth node 208 and the fifth node 210.

A modified tanner graph such as the one shown in FIG. 5 may have a minimum cycle distance. Such minimum distance may be called the "girth" of the modified tanner graph. For example, the girth of the modified tanner graph in FIG. 5 would be four.

Girth may be associated with error conditions such that the smaller the girth of a modified tanner graph, the greater the probability of error of the corresponding codeword because of the nature of the belief-propagation algorithm used during decoding.

One skilled in the art may therefore appreciate that all other features of codewords and trapping sets being equal, features such as adjacent non-zero bits, distance between non-zero bits and girth may inherently impact the error probability of a LDPC code. LDPC codes may therefore be ordered according to an estimated probability of error based on the existence and extent of such features in each LDPC code.

Figure 6:
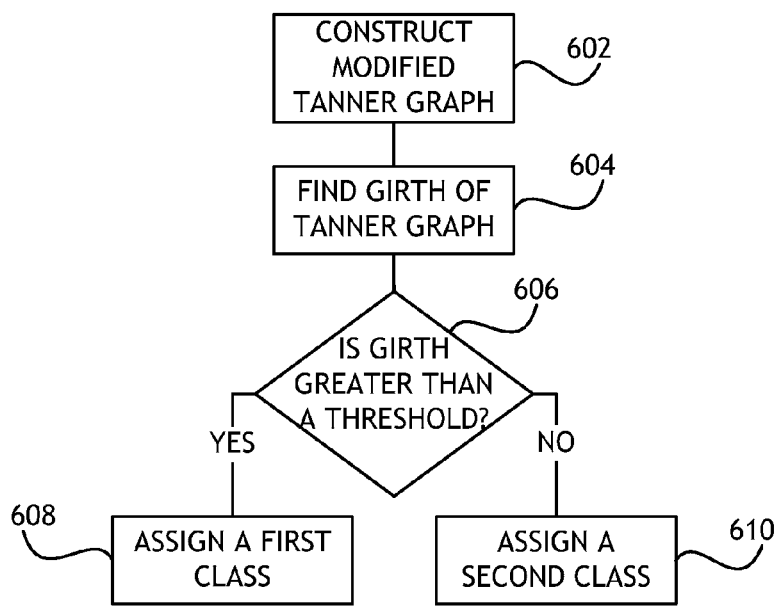
FIG. 6 shows a flowchart for a method of categorizing LDPC codewords based on the girth of a modified tanner graph.

Referring to FIG. 6, a flowchart for a method of categorizing LDPC codewords based on the girth of a modified tanner graph is shown. A processor attempting to categorize LDPC codes according to features of the LDPC code may receive a word produced according to the LDPC code and construct 602 a modified tanner graph as described herein. The processor may then find 604 the girth of the modified tanner graph. If the processor determines 606 that the modified tanner graph has a girth greater than some predefined threshold, the processor may assign 608 the code to a class indicating a decreased estimated error probability; on the other hand, if the processor determines 606 that the modified tanner graph has a girth less than or equal to some predefined threshold, the processor may assign 610 the code to a class indicating an increased estimated error probability.

Figure 7:
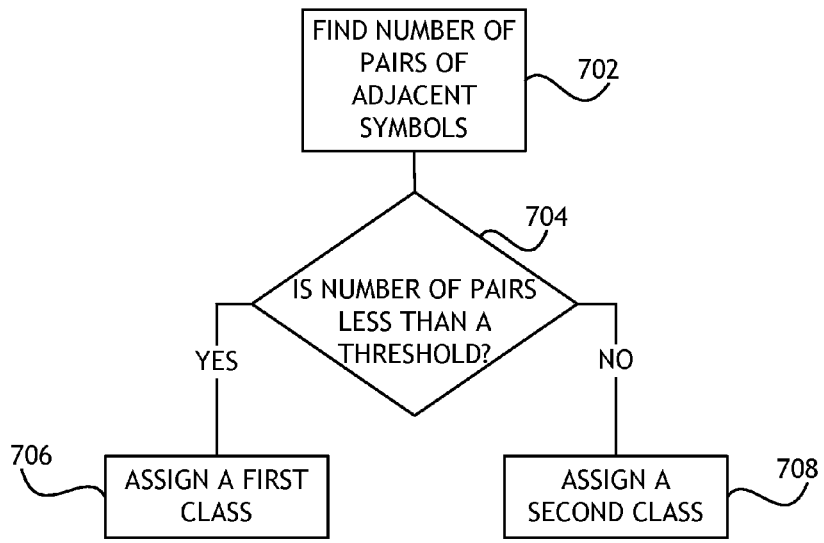
FIG. 7 shows a flowchart for a method of categorizing LDPC codewords based on the number of adjacent variable nodes.

Referring to FIG. 7, a flowchart for a method of categorizing LDPC codewords based on the number of adjacent variable nodes is shown. A processor attempting to categorize LDPC codes according to features of the LDPC code may receive a word produced according to the LDPC code. The processor may then find 702 the number of pairs of adjacent, non-zero symbols wherein at least one non-zero bit of one symbol is adjacent to at least one non-zero bit of another symbol. If the processor determines 704 that the number of pairs is less than some predefined threshold, the processor may assign 706 the code to a class indicating a decreased estimated error probability; on the other hand, if the processor determines 704 that the number of pairs is greater than or equal to some predefined threshold, the processor may assign 708 the code to a class indicating an increased estimated error probability.

Figure 8:
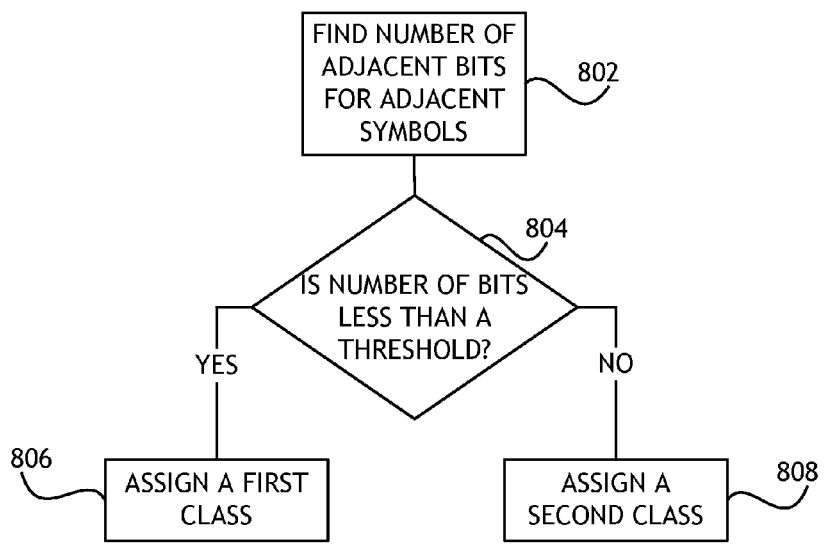
FIG. 8 shows a flowchart for a method of categorizing LDPC codewords based on the number of adjacent bits.

Referring to FIG. 8, a flowchart for a method of categorizing LDPC codewords based on the number of adjacent bits is shown. A processor attempting to categorize LDPC codes according to features of the LDPC code may receive a word produced according to the LDPC code. The processor may then find 802 the number of adjacent, non-zero bits in adjacent symbols in the word. If the processor determines 804 that the number of adjacent bits is less than some predefined threshold, the processor may assign 806 the code to a class indicating a decreased estimated error probability; on the other hand, if the processor determines 806 that the number of pairs is greater than or equal to some predefined threshold, the processor may assign 808 the code to a class indicating an increased estimated error probability.

Figure 9:
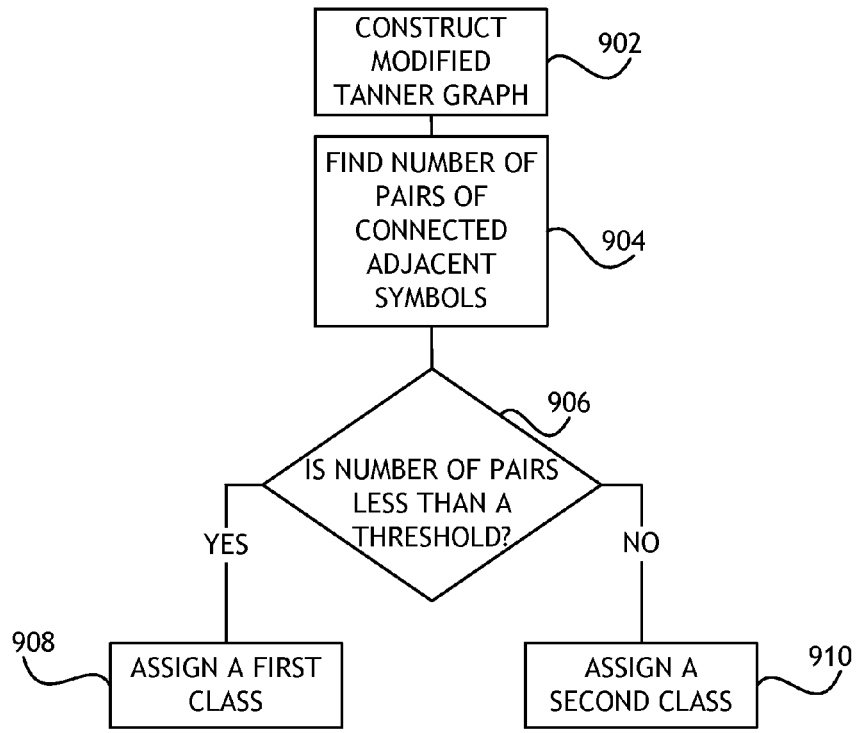
FIG. 9 shows a flowchart for a method of categorizing LDPC codewords based on the number of adjacent pairs of connected variable nodes in a tanner graph.

Referring to FIG. 9, a flowchart for a method of categorizing LDPC codewords based on the number of adjacent pairs of connected variable nodes in a tanner graph is shown. A processor attempting to categorize LDPC codes according to features of the LDPC code may receive a word produced according to the LDPC code and construct 902 a modified tanner graph as described herein. The processor may then find 904 the number of pairs of adjacent, non-zero symbols wherein at least one non-zero bit of one symbol is adjacent to at least one non-zero bit of another symbol, and wherein the adjacent symbols are connected by an edge in the modified tanner graph. If the processor determines 906 that the number of pairs is less than some predefined threshold, the processor may assign 908 the code to a class indicating a decreased estimated error probability; on the other hand, if the processor determines 906 that the number of pairs is greater than or equal to some predefined threshold, the processor may assign 910 the code to a class indicating an increased estimated error probability.

Figure 10:
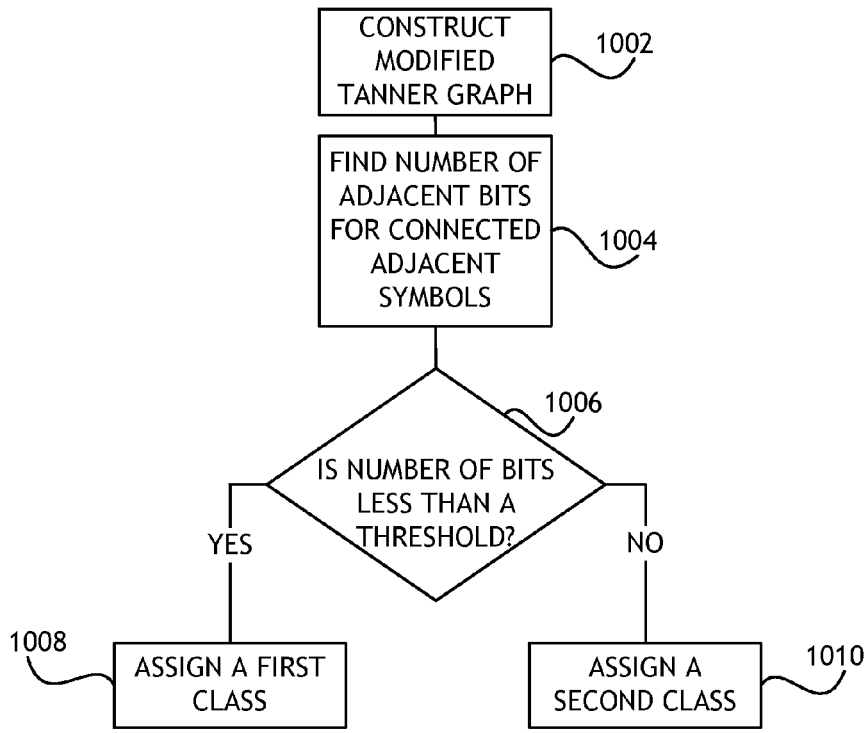
FIG. 10 shows a flowchart for a method of categorizing LDPC codewords based on the number of adjacent bits in adjacent symbols.

Referring to FIG. 10, a flowchart for a method of categorizing LDPC codewords based on the number of adjacent bits in adjacent symbols is shown. A processor attempting to categorize LDPC codes according to features of the LDPC code may receive a word produced according to the LDPC code and construct 1002 a modified tanner graph as described herein. The processor may then find 1004 the number of adjacent, non-zero bits in adjacent symbols in the word wherein the adjacent symbols are connected by an edge in the modified tanner graph. If the processor determines 1006 that the number of pairs is less than some predefined threshold, the processor may assign 1008 the code to a class indicating a decreased estimated error probability; on the other hand, if the processor determines 1006 that the number of pairs is greater than or equal to some predefined threshold, the processor may assign 1010 the code to a class indicating an increased estimated error probability.

Figure 11:
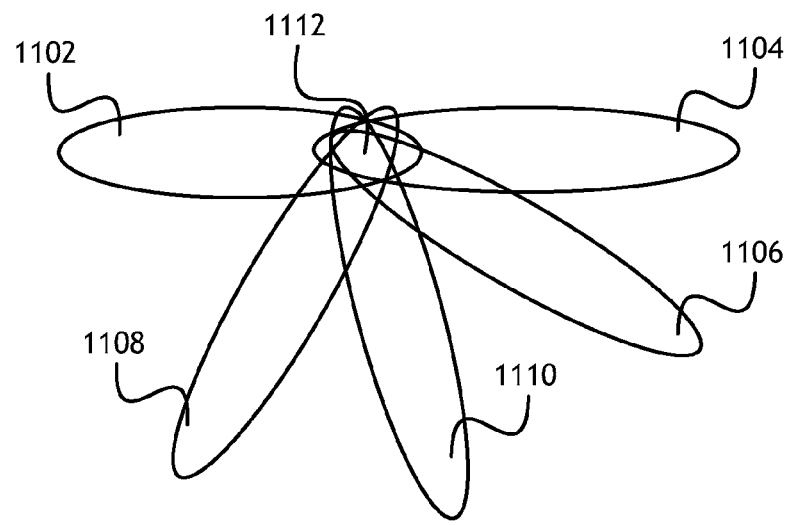
FIG. 11 shows a Venn diagram of categories of LDPC codes based on known error features.

Referring to FIG. 11, a Venn diagram of categories of LDPC codes based on known error features is shown. Categories 1102, 1104, 1106, 1108, 1110 may represent classifications of words where each category 1102, 1104, 1106, 1108, 1110 encompasses words having features that indicate a probability of error of the LDPC code that produced the word. For example, a first category 1102 may encompass words associated with modified tanner graphs having a girth less than a certain predefined threshold; a second category 1104 may encompass words having more than a predefined threshold of adjacent, non-zero symbols; a third category 1106 may encompass words having more than a predefined threshold of adjacent bits of adjacent, non-zero symbols; a fourth category 1108 may encompass words having more than a predefined threshold of adjacent, non-zero symbols connected by edges in a modified tanner graph; and a fifth category 1110 may encompass words having more than a predefined threshold of adjacent bits of adjacent, non-zero symbols connected by edges in a modified tanner graph. Some words may be encompassed by more than one category 1102, 1104, 1106, 1108, 1110, and some words may exist in a high-danger portion 1112 representing words that exist in every category 1102, 1104, 1106, 1108, 1110. Words in the high-danger portion 1112 may be identified as high risk and the LDPC codes used to generate the words in the data set may be ordered according to the number of categories 1102, 1104, 1106, 1108, 1110 into which each word is organized.

Figure 12:
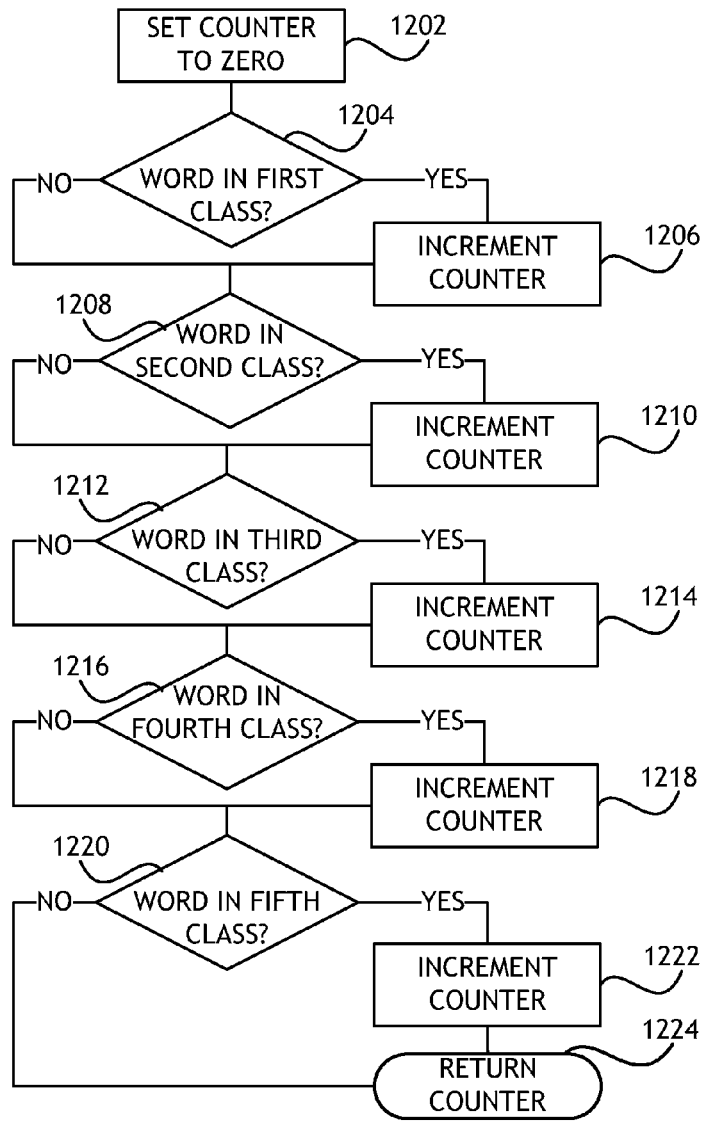
FIG. 12 shows a flowchart for a method of determining a count of error producing features of a LDPC code.

Referring to FIG. 12, a flowchart for a method of determining a count of error producing features of a LDPC code is shown. Once a processor has assigned a word to one or more classes according to one or more features of the word, the processor may produce a count of features having known error probability characteristics. The processor may set 1202 a counter to zero, then the processor may increment the counter for each class including the word. For example, the processor may determine 1204 that the word is in a first class indicating that the word is associated with a modified tanner graph having a girth less than some predefined value and increment 1206 the counter; the processor may then determine 1208 that the word is in a second class indicating that the word has more than a predefined number of non-zero adjacent symbols with directly adjacent non-zero bits and increment 1210 the counter; the processor may then determine 1212 that the word is in a third class indicating that the word has more than a predefined number of adjacent non-zero bits in at least two adjacent symbols and increment 1214 the counter; the processor may then determine 1216 that the word is in a fourth class indicating that the word has more than a predefined number of non-zero adjacent symbols with directly adjacent non-zero bits, and that such symbols are connected by an edge in a modified tanner graph, and increment 1218 the counter; and the processor may then determine 1220 that the word is in a third class indicating that the word has more than a predefined number of adjacent non-zero bits in at least two adjacent symbols connected by an edge in a modified tanner graph, and increment 1222 the counter. The processor may then return 1224 the count to a process that orders LDPC codes according to the count for words generated by such LDPC codes.

One skilled in the art may appreciate that even though the forgoing description specifically described words in terms of codes generated by a LDPC code, identical processes may be usefully applied trapping sets for such LDPC codes.

Figure 13:
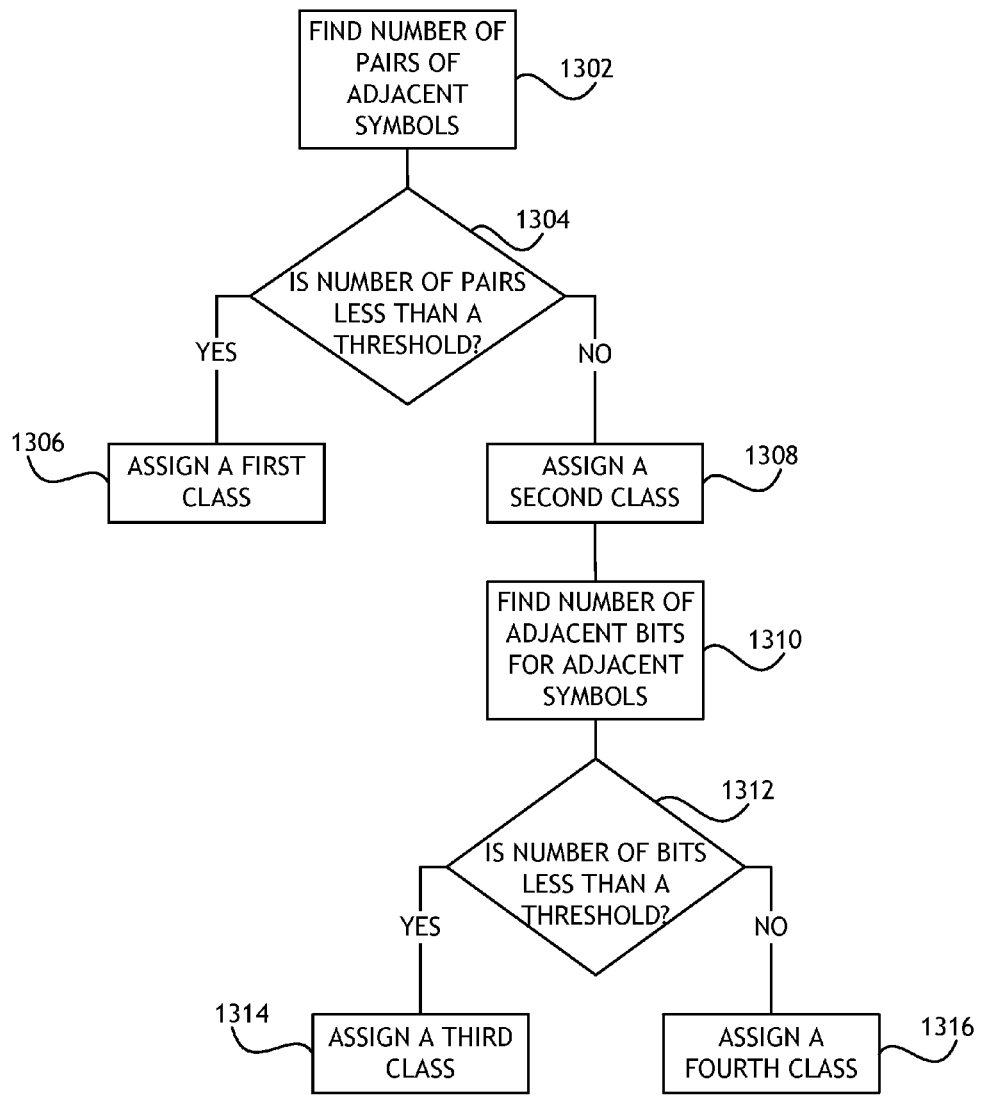
FIG. 13 shows a flowchart for a method of categorizing LDPC codewords based on the number of adjacent variable nodes and the number of adjacent bits.

Referring to FIG. 13, a flowchart for a method of categorizing LDPC codewords based on the number of adjacent variable nodes and the number of adjacent bits is shown. The method shown in FIG. 13 is an alternative embodiment to the methods shown in FIG. 7 and FIG. 8. A processor attempting to categorize LDPC codes according to features of the LDPC code may receive a word produced according to the LDPC code. The processor may then find 1302 the number of pairs of adjacent, non-zero symbols wherein at least one non-zero bit of one symbol is adjacent to at least one non-zero bit of another symbol. If the processor determines 1304 that the number of pairs is less than some predefined threshold, the processor may assign 1306 the code to a class indicating a decreased estimated error probability; on the other hand, if the processor determines 1304 that the number of pairs is greater than or equal to some predefined threshold, the processor may assign 1308 the code to a class indicating an increased estimated error probability and may then find 1310 the number of adjacent, non-zero bits in adjacent symbols in the word. The processor may only find 1310 the number of adjacent, non-zero bits for those codes assigned 1308 to a class indicating an increased estimated error probability not to any codes assigned 1306 to a class indicating a decreased estimated error probability. If the processor determines 1312 that the number of adjacent bits is less than some predefined threshold, the processor may assign 1314 the code to a class indicating a decreased estimated error probability; on the other hand, if the processor determines 1312 that the number of pairs is greater than or equal to some predefined threshold, the processor may assign 1316 the code to a class indicating an increased estimated error probability.

Figure 14:
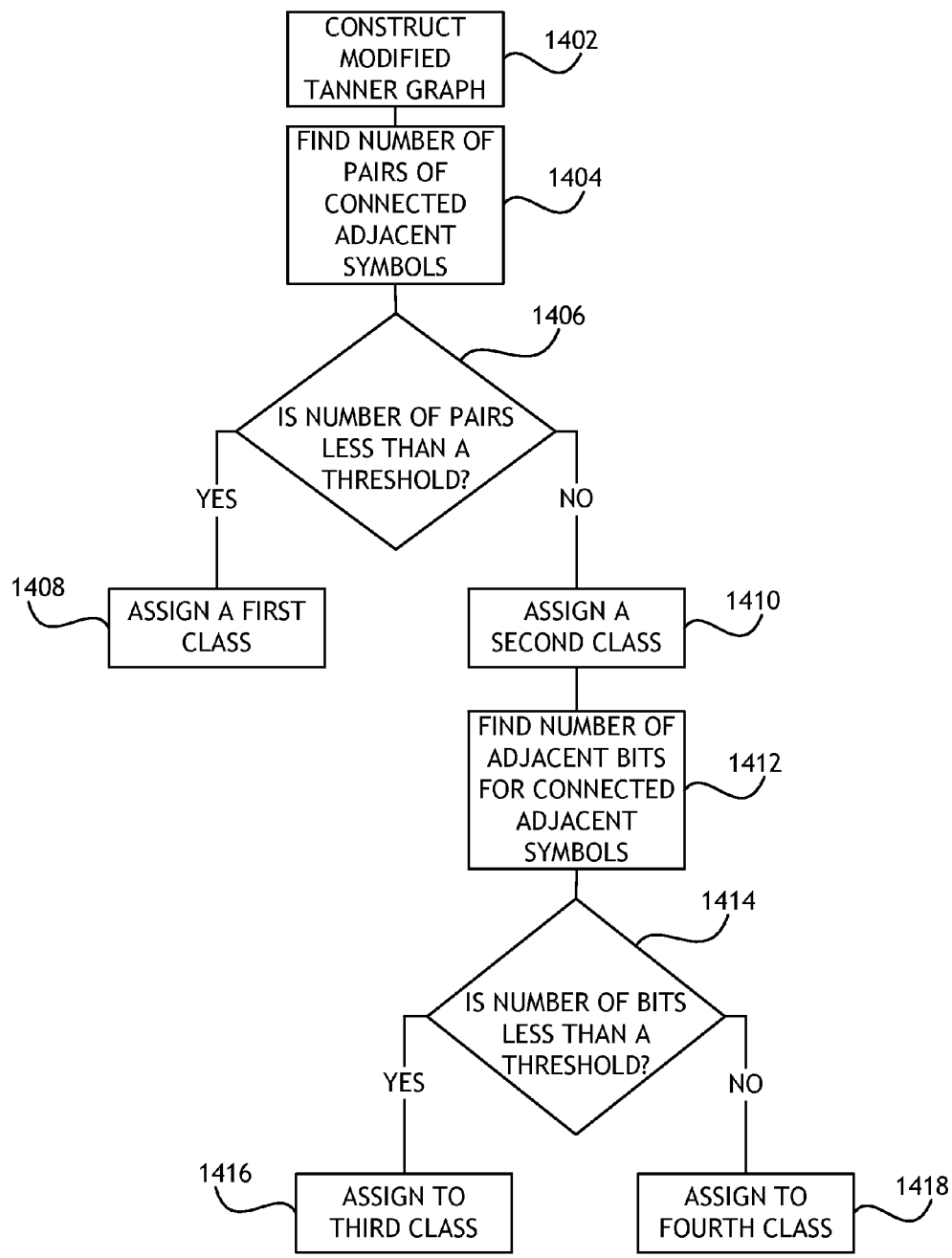
FIG. 14 shows a flowchart for a method of categorizing LDPC codewords based on the number of adjacent pairs of connected variable nodes in a tanner graph and the number of adjacent bits in adjacent symbols.

Referring to FIG. 14, a flowchart for a method of categorizing LDPC codewords based on the number of adjacent pairs of connected variable nodes in a tanner graph and the number of adjacent bits in adjacent symbols is shown. The method shown in FIG. 14 is an alternative embodiment to the methods shown in FIG. 9 and FIG. 10. A processor attempting to categorize LDPC codes according to features of the LDPC code may receive a word produced according to the LDPC code and construct 1402 a modified tanner graph as described herein. The processor may then find 1404 the number of pairs of adjacent, non-zero symbols wherein at least one non-zero bit of one symbol is adjacent to at least one non-zero bit of another symbol, and wherein the adjacent symbols are connected by an edge in the modified tanner graph. If the processor determines 1406 that the number of pairs is less than some predefined threshold, the processor may assign 1408 the code to a class indicating a decreased estimated error probability; on the other hand, if the processor determines 1406 that the number of pairs is greater than or equal to some predefined threshold, the processor may assign 1410 the code to a class indicating an increased estimated error probability and then find 1412 the number of adjacent, non-zero bits in adjacent symbols in the word wherein the adjacent symbols are connected by an edge in the modified tanner graph. The processor may only find 1412 the number of adjacent, non-zero bits for those codes assigned 1410 to a class indicating an increased estimated error probability; not to any codes assigned 1408 to a class indicating a decreased estimated error probability. If the processor determines 1414 that the number of pairs is less than some predefined threshold, the processor may assign 1416 the code to a class indicating a decreased estimated error probability; on the other hand, if the processor determines 1414 that the number of pairs is greater than or equal to some predefined threshold, the processor may assign 1418 the code to a class indicating an increased estimated error probability.

Figure 15:
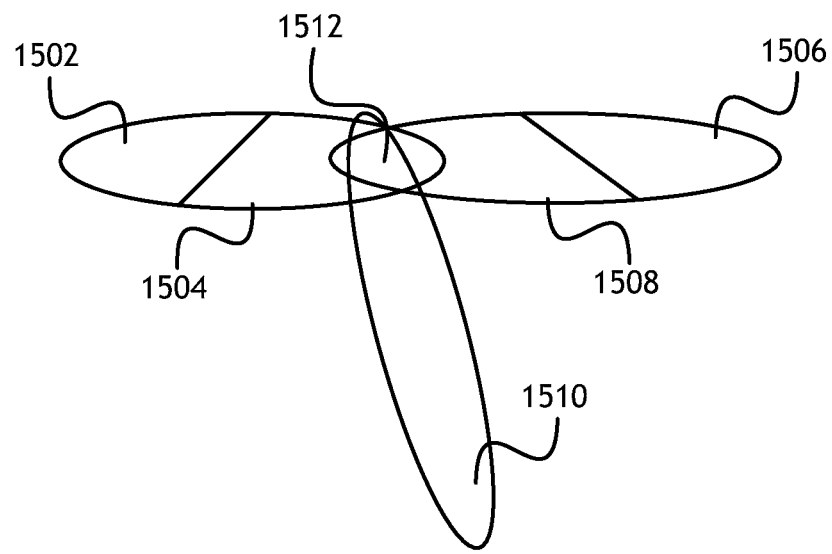
FIG. 15 shows a Venn diagram of categories of LDPC codes based on known error features.

Referring to FIG. 15, a Venn diagram of categories of LDPC codes based on known error features is shown. Categories 1502, 1504, 1506, 1508, 1510 may represent classifications of words where each category 1502, 1504, 1506, 1508, 1510 encompasses words having features that indicate a probability of error of the LDPC code that produced the word. For example, a first category 1502 may encompass words having more than a predefined threshold of adjacent, non-zero symbols but less than a predefined threshold of adjacent, non-zero bits; a second category 1504 may encompass words having more than a predefined threshold of adjacent, non-zero symbols and more than a predefined threshold of adjacent bits of adjacent, non-zero symbols; a third category 1506 may encompass words having more than a predefined threshold of adjacent, non-zero symbols connected by edges in a modified tanner graph but less than a predefined threshold of adjacent, non-zero bits of adjacent, non-zero symbols connected by edges in a modified tanner graph; a fourth category 1508 may encompass words having more than a predefined threshold of adjacent, non-zero symbols connected by edges in a modified tanner graph and more than a predefined threshold of adjacent bits of adjacent, non-zero symbols connected by edges in a modified tanner graph; and a fifth category 1510 may encompass words associated with modified tanner graphs having a girth less than a certain predefined threshold.

Some words may be encompassed by more than one category 1502, 1504, 1506, 1508, 1510, and some words may exist in a high-danger portion 1512 representing words that exist in categories of maximum risk 1504, 1508, 1510. Words in the high-danger portion 1512 may be identified as high risk and the LDPC codes used to generate the words in the data set may be ordered according to the number and type of categories 1502, 1504, 1506, 1508, 1510 into which each word is organized.

Figure 16:
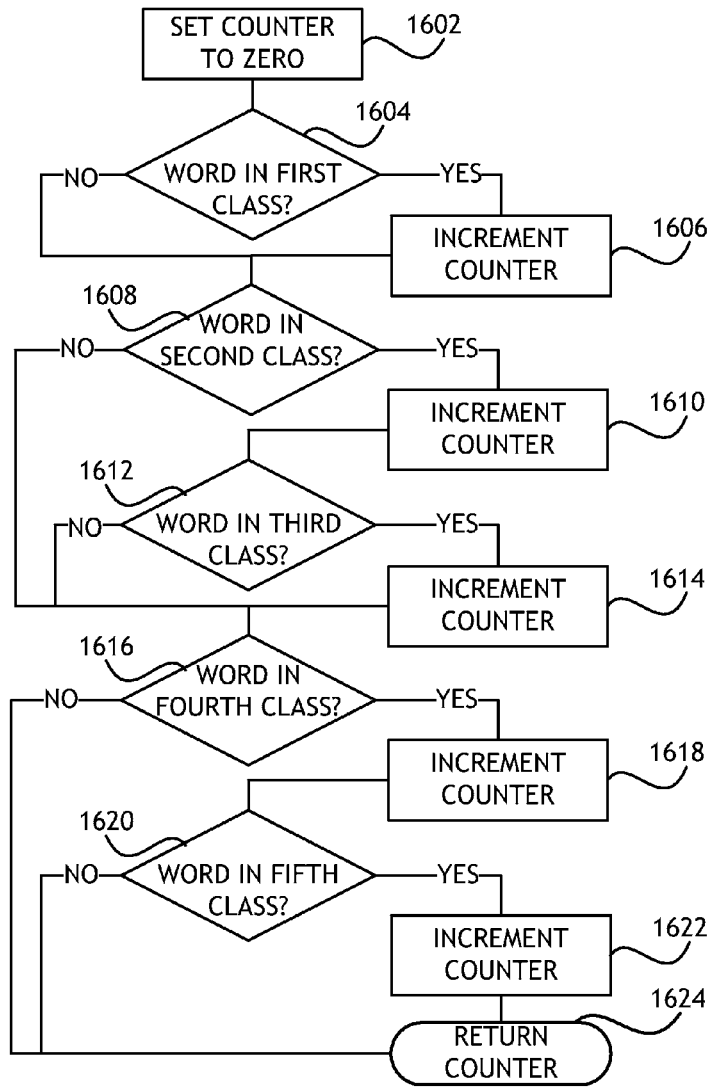
FIG. 16 shows a flowchart for a method of determining a count of error producing features of a LDPC code.

Referring to FIG. 16, a flowchart for a method of determining a count of error producing features of a LDPC code. Once a processor has assigned a word to one or more classes according to one or more features of the word, the processor may produce a count of features having known error probability characteristics. The processor may set 1602 a counter to zero, then the processor may increment the counter for each class including the word. For example, the processor may determine 1604 that the word is in a first class indicating that the word is associated with a modified tanner graph having a girth less than some predefined value and increment 1606 the counter; the processor may then determine 1608 if the word is in a second class indicating that the word has more than a predefined number of non-zero adjacent symbols with directly adjacent non-zero bits. If so, the processor may increment 1610 the counter and then determine 1612 if the word is in a third class indicating that the word has more than a predefined number of adjacent non-zero bits in at least two adjacent symbols. If so, the processor may increment 1614 the counter. The processor may then determine 1616 if the word is in a fourth class indicating that the word has more than a predefined number of non-zero adjacent symbols with directly adjacent non-zero bits, and that such symbols are connected by an edge in a modified tanner graph. If so, the processor may increment 1618 the counter and then determine 1620 if the word is in a third class indicating that the word has more than a predefined number of adjacent non-zero bits in at least two adjacent symbols connected by an edge in a modified tanner graph. If so, the processor may increment 1622 the counter. The processor may then return 1624 the count to a process that orders LDPC codes according to the count for words generated by such LDPC codes.

One skilled in the art may appreciate that even though the forgoing description specifically described words in terms of codes generated by a LDPC code, identical processes may be usefully applied trapping sets for such LDPC codes.

Figure 17:
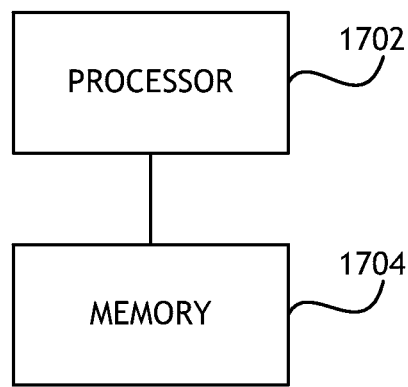
FIG. 17 shows a block diagram of a computing device useful for implementing embodiments of the present invention.

Referring to FIG. 17, a block diagram of a computing device useful for implementing embodiments of the present invention is shown. The computing device may include a processor 1702 connected to a memory 1704. The processor 1702 may be configured to execute computer executable program code to implement methods according to embodiments of the present invention. The memory 1704 may be configured to store computer executable program code to implement methods according to embodiments of the present invention and to store output of embodiments of the present invention in appropriate data structures.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for selecting a LDPC code in a data communication apparatus comprising:
receiving a word generated using a LDPC code;
analyzing the word to determine if the word includes a first feature indicative of a first known impact on error probability;
analyzing the word to determine if the word includes a second feature indicative of a second known impact on error probability;
determining an estimated error probability associated with the LDPC code based on the first feature and the second feature without decoding an encoded word;

classifying the LDPC code into one of a plurality of LDPC code classifications, each of the plurality of LDPC code classifications associate with an estimated error probability;

ordering the LDPC code classifications based on the estimated error probability; and selecting a LDPC code from the plurality of ordered LDPC code classifications for use by a data communication apparatus based on the estimated error probability.

2. The method of claim 1, further comprising:
constructing a modified tanner graph associated with the word; and
determining a girth of the modified tanner graph,
wherein the first feature indicative of a first known impact on error probability is the girth.

3. The method of claim 2, wherein:
the second feature indicative of a second known impact on error probability is the number of adjacent, non-zero symbol pairs with adjacent, non-zero bits connected by an edge in the modified tanner graph; and
analyzing the word to determine if the word includes a second feature comprises determining if the word includes more than a threshold number of adjacent, non-zero symbol pairs with adjacent, non-zero bits connected by an edge in the modified tanner graph.

4. The method of claim 2, wherein:
the second feature indicative of a second known impact on error probability is the number of adjacent, non-zero bits of adjacent, non-zero symbol pairs with adjacent, non-zero bits connected by an edge in the modified tanner graph; and
analyzing the word to determine if the word includes a first feature comprises determining if the word includes more than a threshold number of adjacent, non-zero bits of adjacent, non-zero symbol pairs with adjacent, non-zero bits connected by an edge in the modified tanner graph.

5. The method of claim 1, wherein:
the first feature indicative of a first known impact on error probability is the number of adjacent, non-zero symbol pairs with adjacent, non-zero bits; and
analyzing the word to determine if the word includes a first feature comprises determining if the word includes more than a threshold number of adjacent, non-zero symbol pairs with adjacent, non-zero bits.

6. The method of claim 1, wherein:
the first feature indicative of a first known impact on error probability is the number of adjacent, non-zero bits of adjacent, non-zero symbol pairs; and
analyzing the word to determine if the word includes a first feature comprises determining if the word includes more than a threshold number of adjacent, non-zero bits of adjacent, non-zero symbol pairs.

7. The method of claim 1, further comprising constructing a modified tanner graph associated with the word, wherein
the first feature indicative of a first known impact on error probability is the number of adjacent, non-zero symbol pairs with adjacent, non-zero bits connected by an edge in the modified tanner graph; and
analyzing the word to determine if the word includes a first feature comprises determining if the word includes more than a threshold number of adjacent, non-zero symbol pairs with adjacent, non-zero bits connected by an edge in the modified tanner graph.

8. The method of claim 1, further comprising constructing a modified tanner graph associated with the word, wherein
the first feature indicative of a first known impact on error probability is the number of adjacent, non-zero bits of adjacent, non-zero symbol pairs with adjacent, non-zero bits connected by an edge in the modified tanner graph; and
analyzing the word to determine if the word includes a first feature comprises determining if the word includes more than a threshold number of adjacent, non-zero bits of adjacent, non-zero symbol pairs with adjacent, non-zero bits connected by an edge in the modified tanner graph.

9. An apparatus for selecting a LDPC code comprising:
a processor;
memory connected to the processor; and
computer executable program code configured to execute on the processor,
wherein the computer executable program code is configured to:
receive a word generated using a LDPC code;
analyze the word to determine if the word includes a first feature indicative of a first known impact on error probability;
analyze the word to determine if the word includes a second feature indicative of a second known impact on error probability;
determine an estimated error probability associated with the LDPC code based on the first feature and the second feature without decoding an encoded word;
classify the LDPC code into one of a plurality of LDPC code classifications, each of the plurality of LDPC code classifications associate with an estimated error probability;
order the LDPC code classifications based on the estimated error probability; and
select a LDPC code from the plurality of ordered LDPC code classifications for use by a data communication apparatus based on the estimated error probability.

10. The apparatus of claim 9, wherein the computer executable program code is further configured to:
construct a modified tanner graph associated with the word; and
determine a girth of the modified tanner graph,
wherein the first feature indicative of a first known impact on error probability is the girth.

11. The apparatus of claim 10, wherein:
the second feature indicative of a second known impact on error probability is the number of adjacent, non-zero symbol pairs with adjacent, non-zero bits connected by an edge in the modified tanner graph; and
analyzing the word to determine if the word includes a second feature comprises determining if the word includes more than a threshold number of adjacent, non-zero symbol pairs with adjacent, non-zero bits connected by an edge in the modified tanner graph.

12. The apparatus of claim 10, wherein:
the second feature indicative of a second known impact on error probability is the number of adjacent, non-zero bits of adjacent, non-zero symbol pairs with adjacent, non-zero bits connected by an edge in the modified tanner graph; and
analyzing the word to determine if the word includes a first feature comprises determining if the word includes more than a threshold number of adjacent, non-zero bits of adjacent, non-zero symbol pairs with adjacent, non-zero bits connected by an edge in the modified tanner graph.

13. The apparatus of claim 9, wherein:
the first feature indicative of a first known impact on error probability is the number of adjacent, non-zero symbol pairs with adjacent, non-zero bits; and analyzing the word to determine if the word includes a first feature comprises determining if the word includes more than a threshold number of adjacent, non-zero symbol pairs with adjacent, non-zero bits.

14. The apparatus of claim 9, wherein:
the first feature indicative of a first known impact on error probability is the number of adjacent, non-zero bits of adjacent, non-zero symbol pairs; and
analyzing the word to determine if the word includes a first feature comprises determining if the word includes more than a threshold number of adjacent, non-zero bits of adjacent, non-zero symbol pairs.

15. The apparatus of claim 9, wherein the computer executable program code is further configured to construct a modified tanner graph associated with the word, wherein
the first feature indicative of a first known impact on error probability is the number of adjacent, non-zero symbol pairs with adjacent, non-zero bits connected by an edge in the modified tanner graph; and
analyzing the word to determine if the word includes a first feature comprises determining if the word includes more than a threshold number of adjacent, non-zero symbol pairs with adjacent, non-zero bits connected by an edge in the modified tanner graph.

16. The apparatus of claim 9, wherein the computer executable program code is further configured to construct a modified tanner graph associated with the word, wherein
the first feature indicative of a first known impact on error probability is the number of adjacent, non-zero bits of adjacent, non-zero symbol pairs with adjacent, non-zero bits connected by an edge in the modified tanner graph; and
analyzing the word to determine if the word includes a first feature comprises determining if the word includes more than a threshold number of adjacent, non-zero bits of adjacent, non-zero symbol pairs with adjacent, non-zero bits connected by an edge in the modified tanner graph.

17. A method for ordering two or more LDPC codes in a data communication apparatus based on relative estimated error probability comprising:
identifying one or more features of a word generated by a first LDPC code, wherein such one or more features are associated with a known impact on error probability without decoding an encoded word;
generating a first LDPC code feature count by counting the one or more features of the word generated by a first LDPC code;
identifying one or more features of a word generated by a second LDPC code, wherein such one or more features are associated with a known impact on error probability without decoding an encoded word;
generating a second LDPC code feature count by counting the one or more features of the word generated by a second LDPC code;
comparing the first LDPC code feature count to the second LDPC code feature count to determine the LDPC code having the fewest features associated with a known impact on error probability; and
selecting one of the first LDPC code or the second LDPC code for use by the data communication system based on the comparison of LDPC code feature counts.

18. The method of claim 17, wherein at least one of the one or more features of a word generated by a first LDPC code is a girth of a modified tanner graph associated with the word generated by a first LDPC code.

19. The method of claim 17, wherein at least one of the one or more features of a word generated by a first LDPC code is a number of adjacent, non-zero symbol pairs with adjacent, non-zero bits.

20. The method of claim 17, wherein at least one of the one or more features of a word generated by a first LDPC code is a number of adjacent, non-zero bits of adjacent, non-zero symbol pairs.

* * * * *